US010116254B1

(12) United States Patent
Bosley

(10) Patent No.: US 10,116,254 B1
(45) Date of Patent: Oct. 30, 2018

(54) SOLAR-POWERED VENDING MACHINE AND RELATED APPARATUS AND METHODS

(71) Applicant: Brian Bosley, South Ponte Vedra Beach, FL (US)

(72) Inventor: Brian Bosley, South Ponte Vedra Beach, FL (US)

( * ) Notice: Subject to any disclaimer, the term of this patent is extended or adjusted under 35 U.S.C. 154(b) by 163 days.

(21) Appl. No.: 14/933,124

(22) Filed: Nov. 5, 2015

Related U.S. Application Data

(63) Continuation of application No. 14/736,741, filed on Jun. 11, 2015, now abandoned.

(60) Provisional application No. 62/010,675, filed on Jun. 11, 2014.

(51) Int. Cl.
*H02S 10/40* (2014.01)
*H02S 20/30* (2014.01)
*H02S 20/32* (2014.01)
*H02S 30/20* (2014.01)
*G07F 9/10* (2006.01)
*H02S 40/38* (2014.01)
*G01R 31/36* (2006.01)

(52) U.S. Cl.
CPC .......... *H02S 30/20* (2014.12); *G01R 31/3606* (2013.01); *G01R 31/3689* (2013.01); *G07F 9/10* (2013.01); *H02S 10/40* (2014.12); *H02S 20/30* (2014.12); *H02S 20/32* (2014.12); *H02S 40/38* (2014.12)

(58) Field of Classification Search
CPC .......... H02S 10/00; H02S 10/40; H02S 20/00; H02S 20/30; H02S 20/32; H02S 30/00; H02S 30/20
See application file for complete search history.

(56) References Cited

U.S. PATENT DOCUMENTS

| | | | | |
|---|---|---|---|---|
| 5,379,596 | A * | 1/1995 | Grayson | F25B 27/002 136/245 |
| 5,969,501 | A * | 10/1999 | Glidden | F24J 2/523 320/101 |
| 6,131,399 | A * | 10/2000 | Hall | G06Q 10/087 221/150 R |
| 2007/0240442 | A1* | 10/2007 | Costanzo | F25B 27/005 62/235.1 |
| 2011/0146751 | A1* | 6/2011 | McGuire | F03D 9/007 136/245 |

(Continued)

FOREIGN PATENT DOCUMENTS

JP          02003534          1/1990

*Primary Examiner* — Lindsey A Bernier
(74) *Attorney, Agent, or Firm* — Allen Dyer Doppelt & Gilchrist

(57) ABSTRACT

A solar-powered vending machine includes a photovoltaic (PV) panel assembly connected to a vending machine. The PV panel assembly includes a panel subassembly and mounting subassembly connecting the panel subassembly to the vending machine. The panel subassembly includes a plurality of PV panels foldably interconnected to expand to a deployed width greater than a vending machine width and collapse to a stowed width less than or approximately equal to the vending machine width. The mounting frame supports the PV panels for movement between a deployed position above the vending machine and a stowed position adjacent a side of the vending machine.

14 Claims, 4 Drawing Sheets

(56) References Cited

U.S. PATENT DOCUMENTS

2012/0249049 A1* 10/2012 Hixson ............... H01M 2/1077
320/101
2015/0013750 A1* 1/2015 Meppelink .............. H02S 30/20
136/245

* cited by examiner

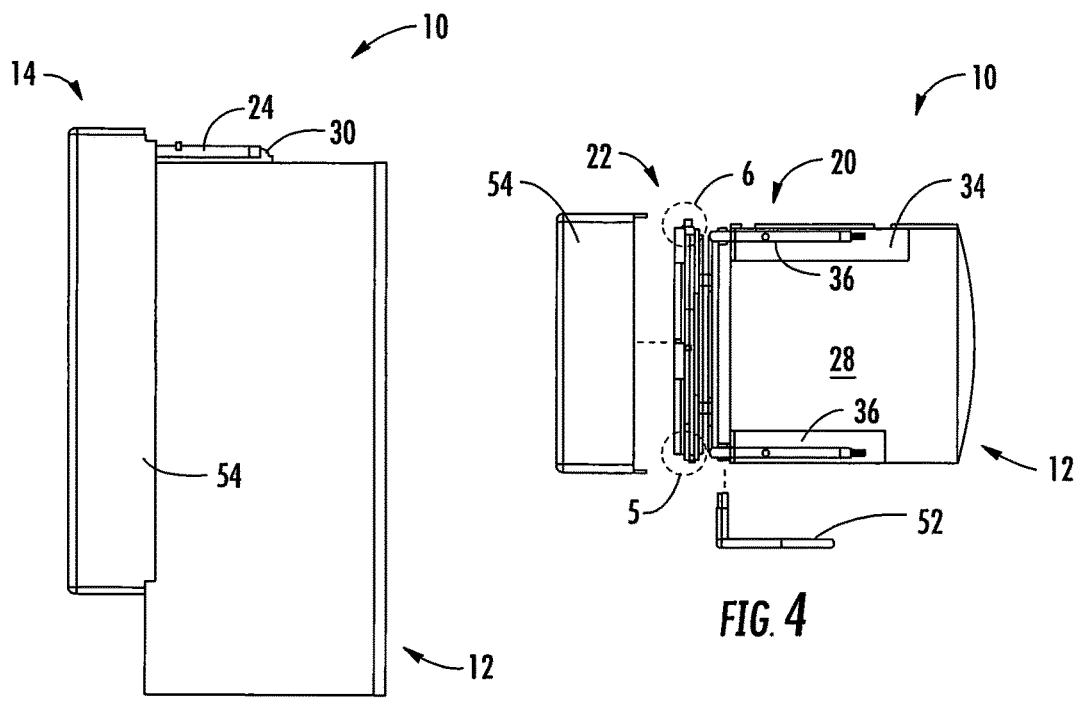
FIG. 3
FIG. 4
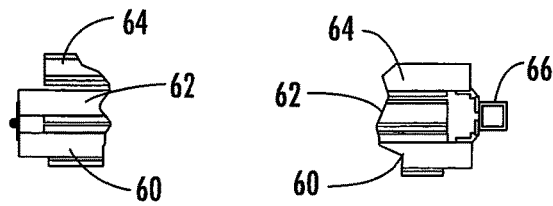
FIG. 5
FIG. 6
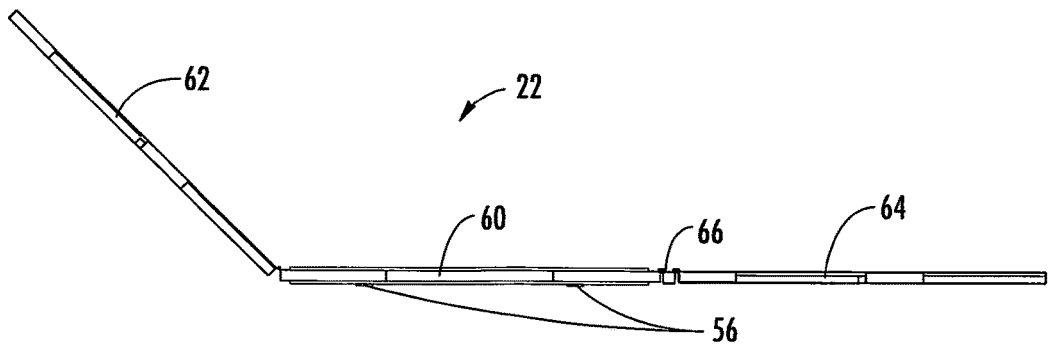
FIG. 7

SOLAR-POWERED VENDING MACHINE AND RELATED APPARATUS AND METHODS

CROSS-REFERENCE TO RELATED APPLICATION

This application is a continuation of U.S. application Ser. No. 14/736,741 filed on Jun. 11, 2015, which claims the benefit of U.S. Provisional Patent Application Ser. No. 62/010,675, filed on Jun. 11, 2014, the contents of which applications are herein incorporated by reference in their entirety.

FIELD OF THE INVENTION

The present invention relates to solar-powered vending machines, and more particularly, to vending machines with electrically powered refrigeration units.

BACKGROUND OF THE INVENTION

While the basic idea of a vending machines receiving electrical power from one or more photovoltaic (PV) panels has been tried in various forms, actually producing a refrigerated vending machine that can rely solely or predominantly on solar power in a reasonable range of climates has proven quite a bit more difficult. Vending machines with relatively small numbers of PV panels mounted thereto typically rely heavily on external AC power to supplement solar power generation. On the other hand, machines coupled with much large PV panel arrays might produce sufficient power to run the machine, but cost and portability issues make this an unreasonable solution for many vending machine locations.

SUMMARY OF THE INVENTION

In view of the foregoing, it is an object of the present invention to provide an improved solar-powered vending machine and related apparatus and methods. According to an embodiment of the present invention, a solar-powered vending machine includes a PV panel assembly connected to a vending machine or other portable machine. The PV panel assembly includes a panel subassembly and mounting subassembly connecting the panel subassembly to the vending machine. The panel subassembly includes a plurality of PV panels foldably interconnected to expand to a deployed width greater than a vending machine width and collapse to a stowed width less than or approximately equal to the vending machine width. The mounting frame supports the PV panels for movement between a deployed position above the vending machine and a stowed position adjacent a side of the vending machine.

According to an aspect of the present invention, the solar-powered vending machine includes a refrigeration unit that runs on direct current (DC) electrical power, such that DC-to-AC conversion between the PV panels and the refrigeration unit is not required. Advantageously, all vending machine electrical loads run on DC electrical power.

According to another aspect of the present invention, additional thermal insulating material is added to the solar-powered vending machine. According to a further aspect of the present invention, a vending machine display allows vending machine users to view at least one power generation characteristic of the solar-powered vending machine.

These and other objects, aspects and advantages of the present invention will be better appreciated in view of the drawings, and following detailed description of preferred embodiments.

BRIEF DESCRIPTION OF THE DRAWINGS

FIG. 3 is a side view of the solar-powered vending machine of FIG. 1, with the PV panel assembly in a stowed position with a transport cover installed thereover;

FIG. 4 is a top view of the solar-powered vending machine of FIG. 1, with the transport cover and deployment handle removed;

FIGS. 5 and 6 are detail end views of the areas 5 and 6 of FIG. 4;

FIG. 7 is an end view of a panel subassembly of the PV panel assembly of FIG. 1 in a partially-unfolded configuration;

DETAILED DESCRIPTION OF PREFERRED EMBODIMENTS

Figure 1:
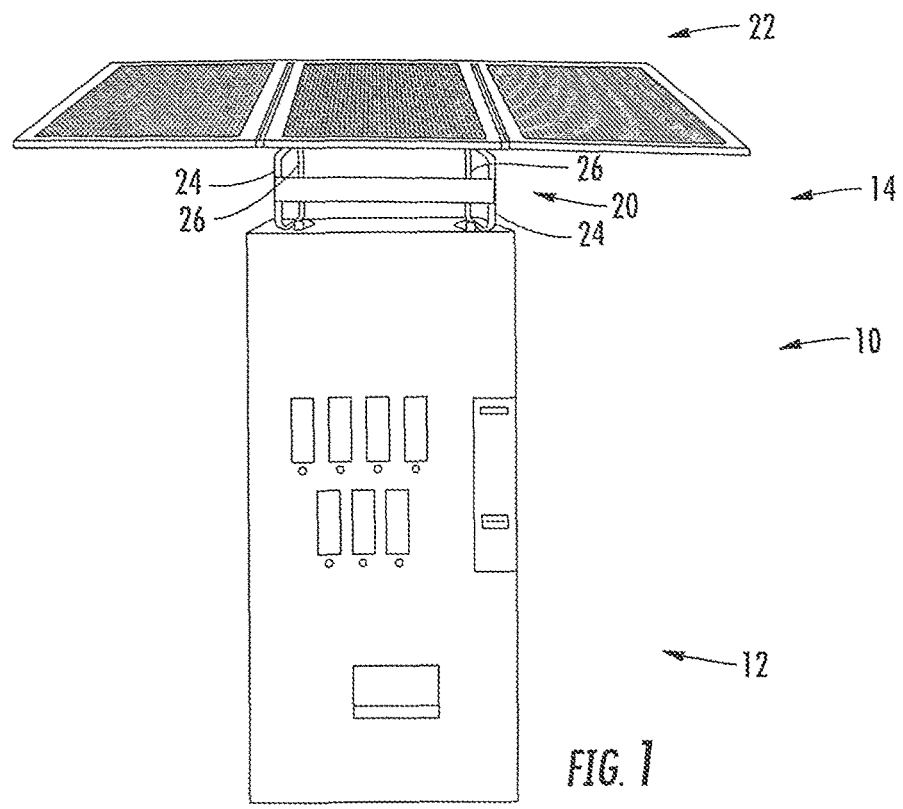
FIG. 1 is a front perspective view of a solar-powered vending machine, including a photovoltaic (PV) panel assembly in a deployed position, according to an embodiment of the present invention.
Figure 2:
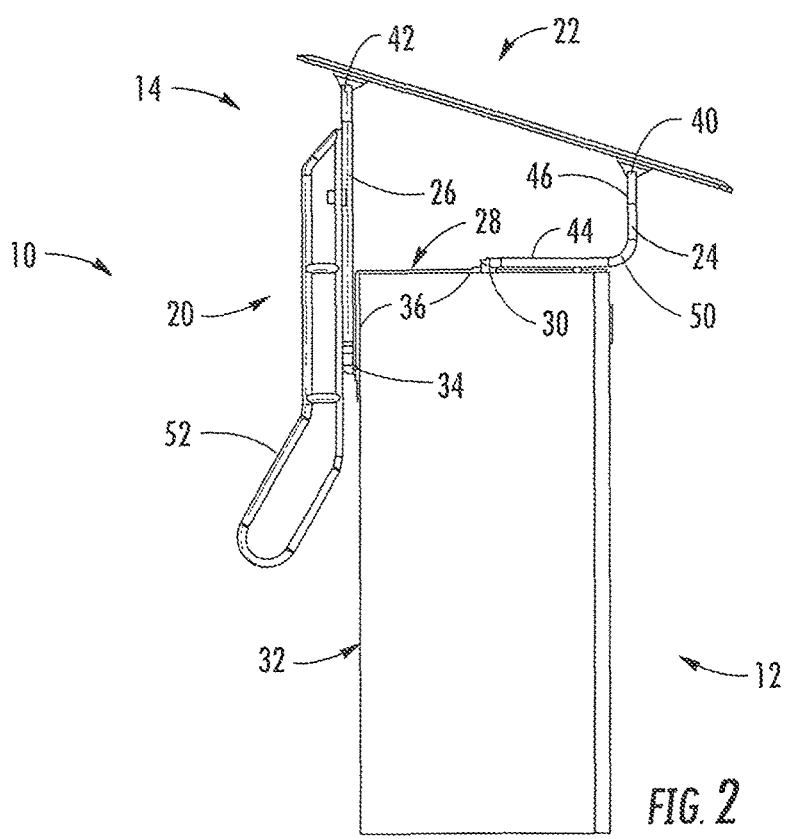
FIG. 2 is a side view of the solar-powered vending machine of FIG. 1, with the PV panel assembly in the deployed position with a deployment handle connected thereto.

Referring to FIGS. 1 and 2, a solar-powered vending machine 10 includes a vending machine 12 and a photovoltaic (PV) panel assembly 14 mechanically and electrically connected thereto. The vending machine 12 depicted is a refrigerated beverage vending machine, however it will be appreciated that the present invention could be beneficially applied to a wide variety of vending machine types or other type of portable machines. The PV panel assembly 14 includes a mounting subassembly 20 connected to the vending machine 12 and a panel subassembly 22 supported on the vending machine 12 by the mounting subassembly for movement between a deployed position (as in FIGS. 1 and 2) and a stowed position (see FIG. 3).

The mounting subassembly 20 includes first and second mounting arms 24, 26 extending between the vending machine 12 and the panel subassembly 22. Preferably, there are at least two first and second mounting arms 24, 26 mounted in parallel. Machine ends of the first mounting arms 24 are pivotably mounted to a top surface 28 of the vending machine 12, about a first pivot axis 30 (axes labeled in FIG. 2 go into page from the indicated point). Machine ends of the second mounting arms 26 are pivotably mounted to a side 32, preferably the rear side, of the vending machine 12, about a second pivot axis 34. Mounting plates 36 can be attached to the top 28 and side 32 to better distribute forces from the mounting subassembly 20 to the vending machine. The top and side mounting plates 36 can be connected at adjacent edges thereof.

Panel ends of the first and second mounting arms 24, 26 are pivotably mounted to the panel subassembly 22 about pivot axes 40, 42, respectively. The vertical heights of the first and second mounting arms 24, 26 are preferably set such that the deployed panel subassembly 22 is held above the top 28 of the machine and forwardly angled. The first mounting arms 24 each have a horizontal portion 44 and a vertical portion 46 separated by an elbow 50. This shape facilitates the transition of the PV panel assembly into the stowed position, in which the second mounting arms 26 pivot about axis 34 extend downwardly therefrom and the first mounting arms 24 pivot about axis 30 so that the horizontal portions 44 extend rearwardly therefrom across the top 28 and the vertical portion extend down the rear side 32. In the stowed position, the pivot axes 40, 42 both lay close the read side 32 and the panel subassembly 22 is held adjacent thereto. A deployment handle 52 removably attached to one of the second legs 26 can be used to facilitate the transition.

Referring to FIG. 3, in the stowed position, the PV panel assembly 14 can be enclosed by a protective cover 54, for protection during transport of the solar-powered vending machine 10. The detachable handle 52 can also be stored within the cover 54. To begin the transition from the stowed position to the deployed position, the cover 54 is removed and the handle 52 is attached to a second leg 26. The panel subassembly 22 can also be conveniently unfolded at this time, although it could alternately be unfolded when above the machine 12.

Referring to FIGS. 5-7, the panel subassembly 22 advantageously includes a plurality of folding PV panel arrays 60-64, which fold to be less than or equal to the width of the side 32 of the machine 12 adjacent which the panel subassembly 22 is stored in the stowed position, but when unfolded have a significantly greater width. In the depicted embodiment, the panel subassembly is a tri-fold design, with the mounting subassembly 20 connecting at mounting points 56 to a central panel 60, with the central panel 60 in turn hingedly connected to first and second side panels 62, 64—resulting in an unfolded width approximately three times that of the vending machine 12.

The first side panel 62 folds directly over the central panel 60, with the second side panel 64 folding over both the central panel 60 and the first side panel 62. To accommodate the thickness of the first side panel 62 and allow the panels 60-64 to lie flat when folded together, a panel spacer 66 extends longitudinally between the central panel 60 and the second side panel 64. The spacer 66 is hingedly connected to both adjacent panels 60, 64, and abuts both along opposite sides thereof when the panel subassembly 22 is unfolded.

Figure 8:
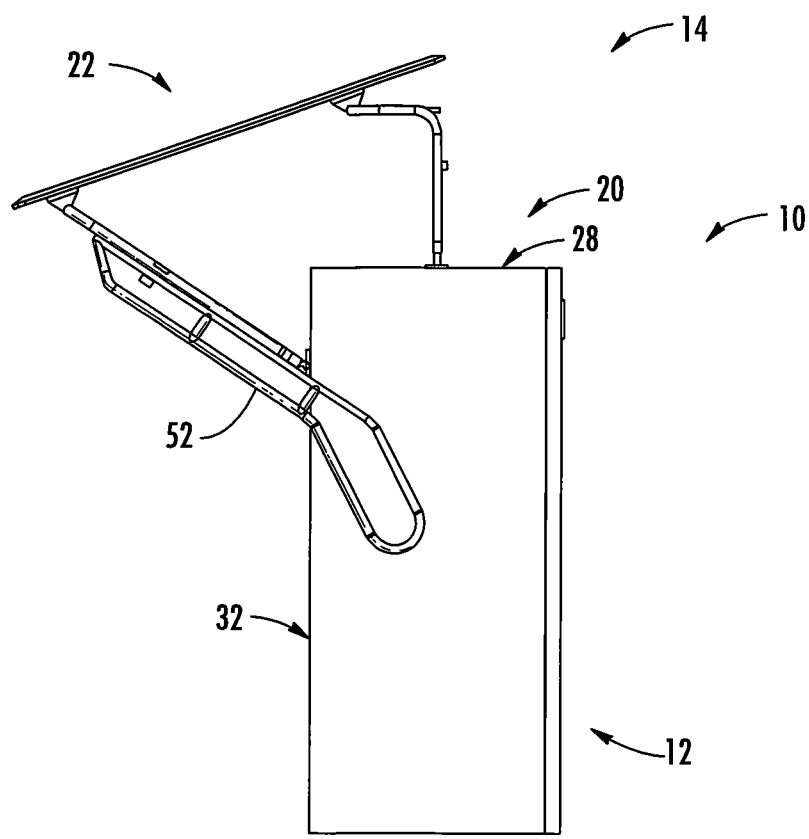
FIG. 8 is a side view of the solar-powered vending machine of FIG. 1, with the PV panel assembly in a partially-deployed position.
Figure 9:
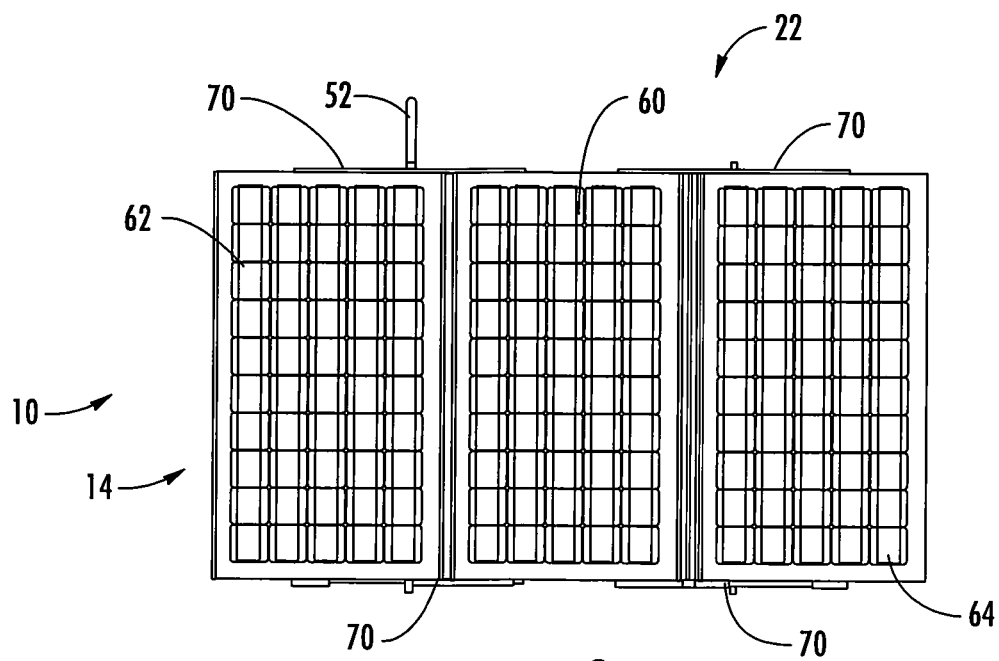
FIG. 9 is a top view of the solar-powered vending machine of FIG. 1, in the deployed position.

Referring to FIG. 8, the handle 52 is used to pivot the PV panel assembly 12 from its stowed position adjacent the rear side 32 of the vending machine 12 to the deployed position above the vending machine (see FIG. 9). The PV panel assembly 12 can further includes torsion springs, hydraulic cylinders or the like to facilitate the lifting of the PV panel assembly 12, and to help prevent unintended movement. Once the PV panel assembly 12 is in place, slide locks 70 or other locking mechanisms on the panel subassembly 22 can be engaged to prevent inadvertent folding of the of the side panels 62, 64. The handle 52 can be removed and stowed for later use.

From the foregoing, it will be appreciated that the PV panel assembly 14 allows a vending machine 12 to be used as a solar-powered vending machine 10 without greatly complicating the transportation and/or set-up of the machine beyond that of a conventional vending machine, while still permitting a relatively large PV panel area for electrical generation once in place. As described in greater detail below, further solar-powered vending machines can be used with, or independently of, the PV panel assembly 14 to further enhance the wider feasibility of solar-powered vending machines.

For example, in refrigerated vending machines, the electrical load required to be satisfied by solar power can be usefully reduced by increasing the amount of thermal insulation applied to the vending machine. In purpose-built solar-powered vending machines, this insulation can be built into the machine. For instance, the refrigerated volume within the vending machine can be designed with additional thermal insulation. Retrofitted vending machines could readily have insulating panels applied externally to outer surfaces of the machine.

Figure 10:
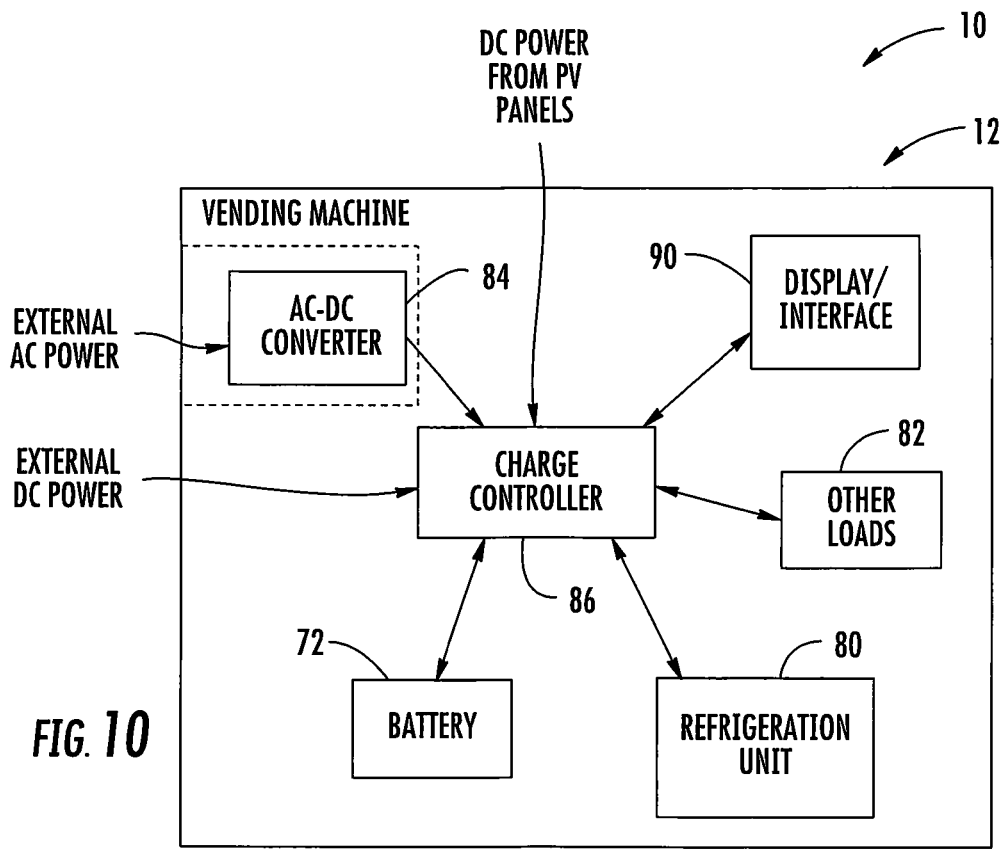
FIG. 10 is a schematic overview of electrical power distribution in the solar-powered vending machine of FIG. 1.

Additionally, conventional vending machines will typically have significant AC electrical loads—being primarily designed to run off of external AC power. When converting a vending machine to use solar power, one option is to apply DC-AC conversion to electrical power supplied from PV panels and/or one or more batteries. However, referring to FIG. 10, significantly better utilization of electrical power from the PV panels (either directly or via one or more batteries 72) can be realized if electrical loads are run off DC electrical power to begin with. Most preferably, a refrigeration unit 80, and most particularly a compressor thereof, can be DC powered. Other loads 82, such as motors for vending apparatus, can also be DC powered.

While the solar-powered vending machine 10 can still be configured to accept external AC power, an AC-DC converter 84 can instead be employed to convert this external AC power to DC power usable by the vending machine 12 loads. The solar-powered vending machine 10 can also be equipped to connect to external DC power; for instance, to allow power sharing by connection with one or more adjacently-located, additional solar-powered vending machines. Power-flow through the solar-powered vending machine 10 is preferably controlled by an intelligent charge controller, which regulates power throughout the machine as well as protects the battery bank 86.

Figure 11:
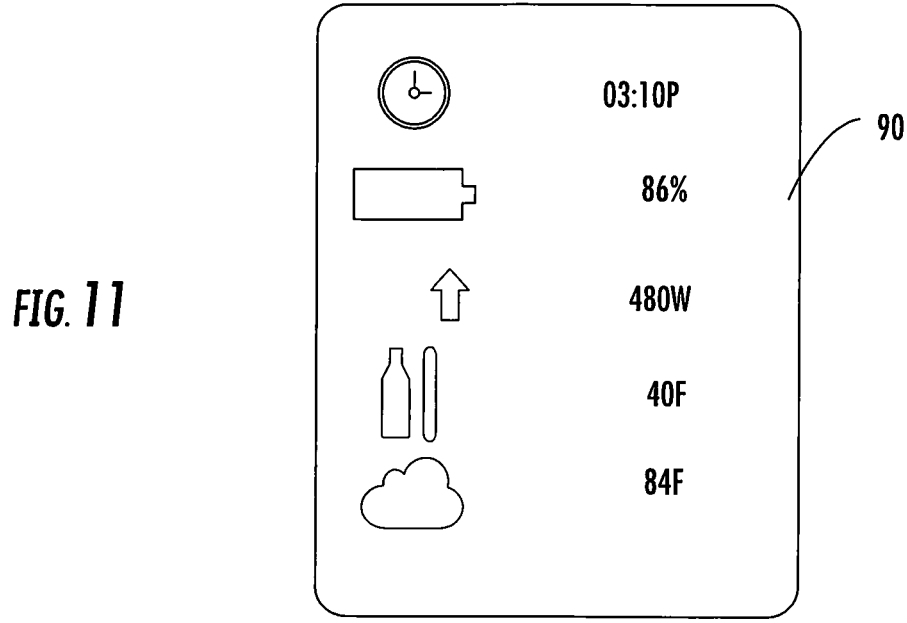
FIG. 11 is a front view of a display/interface screen of the solar-powered vending machine of FIG. 1.

Referring also to FIG. 11, the solar-powered vending machine 10 can be equipped with a vending machine display 90 that displays at least one power generation characteristic of the machine 10. For example, the depicted display 90 allows vending machine users to see battery charge remaining and current solar-power generation. The display 90 can offer other useful information, such as the time of day, vending machine internal temperature, and outdoor temperature.

The display 90 can also allow execution of a "service" mode, via which a vending machine service technician can see other information, such as battery voltage, battery state-of-charge (in a graphical format, indicating, e.g., amp-hours in/out), battery cycle count, charging parameters, etc. The technician could also operate an AC connection timer; for example, for allowing automatic AC power draws based on the time of day. Another control option could be a "reload" mode, in which the vending machine automatically draws AC power for a predetermined time period during and following reloading; for example, the vending machine could automatically begin drawing AC power for three hours after the start of reloading.

The above embodiments are provided for exemplary and illustrative purposes. Those skilled in the art will appreciate that the present invention is not necessarily limited to such an embodiment. Rather, numerous modifications, and adaptations for particular circumstances, fall within the scope of the invention as herein shown and described and of the claims appended hereto.

What is claimed is:

1. A solar-powered vending machine comprising:
a vending machine; and
a photovoltaic (PV) panel assembly connected to the vending machine having a top and a plurality of sides extending downwardly therefrom, the PV panel assembly including:
a panel subassembly having a plurality of foldably interconnected PV panels to expand to a deployed width greater than a vending machine width and collapse to a stowed width less than or approximately equal to the vending machine width; and
a mounting subassembly connecting the panel subassembly to the vending machine and supporting the plurality of foldably interconnected PV panels for movement between a deployed position, in which the plurality of foldably interconnected PV panels are supported above the top of the vending machine unfolded to the deployed width for sun exposure, and a stowed position, in which the plurality of foldably interconnected PV panels extend downwardly adjacent one of the sides of the vending machine folded to the stowed width;
wherein, in the deployed position, at least one of the plurality of foldably interconnected PV panels is supported directly above the top of the vending machine;
wherein the mounting subassembly comprises at least one first mounting arm and at least one second mounting arm extending between the vending machine and the panel subassembly;
wherein the at least one first mounting arm includes a pair of first mounting arms and the at least one second mounting arm includes a pair of second mounting arms; and
wherein respective machine ends of each of the pair of first mounting arms are pivotably mounted to the top of the vending machine about a first pivot axis, and respective machine ends of each of the pair of second mounting arms are pivotably mounted about a second pivot axis to the one of the sides of the vending machine down which the plurality of foldably interconnected PV panels extend in the stowed position.

2. The solar-powered vending machine recited in claim 1, wherein the at least one first and second mounting arms are mounted in parallel.

3. The solar-powered vending machine recited in claim 1, wherein respective panel ends of each of the pair of first mounting arms and respective panel ends of each of the pair of second mounting arms, are pivotably mounted to the panel subassembly.

4. The solar-powered vending machine recited in claim 1, wherein the at least one first mounting arm has a horizontal portion and a vertical portion separated by an elbow, in the stowed position the horizontal portion extending rearwardly across the top of the vending machine and the vertical portion extending down the one of the sides of the vending machine down which the plurality of foldably interconnected PV panels extend in the stowed position.

5. The solar-powered vending machine recited in claim 1, further comprising a deployment handle removably attached to the at least one first mounting arm or the at least one second mounting arm to facilitate transition between the deployed position and the stowed position.

6. The solar-powered vending machine recited in claim 1, wherein at least one mounting plate is attached to the vending machine to distribute forces from the mounting subassembly.

7. The solar-powered vending machine recited in claim 6, wherein the at least one mounting plate includes a top mounting plate and a side mounting plate connected along an edge of the vending machine.

8. The solar-powered vending machine recited in claim 1, wherein the plurality of foldably interconnected PV panels of the panel subassembly include a central panel hingedly connected to a first side panel and a second side panel, and the first side panel folds directly over the central panel, and the second side panel folds over both the central panel and the first side panel.

9. The solar-powered vending machine recited in claim 1, wherein the vending machine includes at least one DC powered component configured to receive DC power supplied from the panel assembly.

10. The solar-powered vending machine recited in claim 9, wherein the at least one DC powered component is a compressor of a refrigeration unit.

11. The solar-powered vending machine recited in claim 1, further comprising a cover placed over the PV panel assembly in the stowed position.

12. The solar-powered vending machine recited in claim 1, further comprising:
at least one DC powered compressor and at least one battery configured to receive DC power supplied from the panel assembly.

13. The solar-powered vending machine recited in claim 12, wherein the vending machine further includes a vending machine display configured to display at least one informational parameter.

14. The solar-powered vending machine recited in claim 13, wherein the at least one informational parameter comprises one or more of battery charge remaining, current solar-power generation parameters, time, date, vending machine internal temperature, outdoor temperature, vending machine battery voltage, vending machine battery state-of-charge, battery cycle count, and one or more battery charging parameters.

* * * * *